United States Patent
Akagi et al.

(10) Patent No.: US 9,601,664 B2
(45) Date of Patent: Mar. 21, 2017

(54) SEMICONDUCTOR LIGHT-EMITTING ELEMENT AND METHOD OF MANUFACTURING THE SAME

(71) Applicant: STANLEY ELECTRIC CO., LTD., Meguro-ku, Tokyo (JP)

(72) Inventors: Takanobu Akagi, Tokyo (JP); Tatsuma Saito, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 14/910,998

(22) PCT Filed: Aug. 1, 2014

(86) PCT No.: PCT/JP2014/070387
§ 371 (c)(1),
(2) Date: Feb. 8, 2016

(87) PCT Pub. No.: WO2015/019969
PCT Pub. Date: Feb. 12, 2015

(65) Prior Publication Data
US 2016/0204309 A1  Jul. 14, 2016

(30) Foreign Application Priority Data
Aug. 9, 2013  (JP) .................. 2013-166465

(51) Int. Cl.
*H01L 21/00* (2006.01)
*H01L 33/00* (2010.01)
(Continued)

(52) U.S. Cl.
CPC .......... *H01L 33/22* (2013.01); *H01L 33/0095* (2013.01); *H01L 33/18* (2013.01)

(58) Field of Classification Search
CPC ...... H01L 33/22; H01L 33/0095; H01L 33/18
(Continued)

(56) References Cited

U.S. PATENT DOCUMENTS

2005/0285132 A1   12/2005  Orita
2009/0087994 A1   4/2009   Lee et al.
(Continued)

FOREIGN PATENT DOCUMENTS

JP    2006049855 A    2/2006
JP    2008515180 A    5/2008
(Continued)

OTHER PUBLICATIONS

International Search Report (ISR) dated Sep. 2, 2014 issued in International Application No. PCT/JP2014/070387.
(Continued)

*Primary Examiner* — David S Blum
(74) *Attorney, Agent, or Firm* — Holtz, Holtz & Volek PC

(57) ABSTRACT

A step of forming, on a surface of a semiconductor structure layer, easily-to-be-etched portions arranged on the basis of crystal directions on the surface of the semiconductor structure layer and a step of subjecting the surface of the semiconductor structure layer to wet etching to form an uneven structure surface including a plurality of protrusions derived from a crystal structure of the semiconductor structure layer on the surface of the semiconductor structure layer are included.

12 Claims, 8 Drawing Sheets

(51) Int. Cl.
*H01L 33/22* (2010.01)
*H01L 33/18* (2010.01)

(58) Field of Classification Search
USPC .......................................... 438/43; 257/103
See application file for complete search history.

(56) References Cited

U.S. PATENT DOCUMENTS

| | | |
|---|---|---|
| 2009/0159907 A1 | 6/2009 | Wang |
| 2011/0233581 A1 | 9/2011 | Sills et al. |
| 2012/0228670 A1 | 9/2012 | Saito |
| 2016/0197231 A1* | 7/2016 | Schellhammer ........ H01L 33/24 257/13 |

FOREIGN PATENT DOCUMENTS

| | | |
|---|---|---|
| JP | 2009010215 A | 1/2009 |
| JP | 2012186335 A | 9/2012 |

OTHER PUBLICATIONS

Extended European Search Report (EESR) dated Jan. 20, 2017 issued in European counterpart Application No. 14834872.5.

* cited by examiner

SEMICONDUCTOR LIGHT-EMITTING ELEMENT AND METHOD OF MANUFACTURING THE SAME

TECHNICAL FIELD

The present invention relates to a semiconductor light-emitting element, such as a light-emitting diode (LED), and a method of manufacturing the same.

BACKGROUND ART

A semiconductor light-emitting element, such as a light-emitting diode, is typically fabricated by growing an n-type semiconductor layer, a light-emitting layer, and a p-type semiconductor layer on a growth substrate and by forming an n-electrode and a p-electrode for applying voltages to the n-type semiconductor layer and the p-type semiconductor layer, respectively.

A semiconductor light-emitting element having a structure without a growth substrate, i.e., what is called a bonded structure, in which a p-electrode is formed on a p-type semiconductor layer and then the element is bonded to a support substrate via a bonding layer has been known in the art as a semiconductor light-emitting element designed to improve the heat dissipation performance in the above-described structure.

As one technique for extracting light emitted from a light-emitting layer to the outside in a greater amount, Patent Literature 1 discloses a technique in which a surface of an n-type semiconductor layer that is exposed after the removal of a growth substrate is wet-etched with an alkali solution to form a plurality of protrusions based on the crystal structure of the semiconductor.

CITATION LIST

Patent Literature

Patent Literature 1: Japanese Patent Application Laid-Open No. 2012-186335

SUMMARY OF INVENTION

Technical Problem

A GaN-based semiconductor has a Wurtzite crystal structure. When a C-minus plane (C$^-$ plane) of a semiconductor layer, made of such a GaN-based semiconductor, is subjected to wet etching with an alkali solution, an uneven structure including hexagonal pyramid-shaped protrusions derived from the Wurtzite crystal structure is formed. When such an uneven structure is formed on a surface of an n-type semiconductor layer, which is a light extraction surface, light emitted from an emission layer is more likely to pass through the uneven structure. Thus, more light can be extracted to the outside. Note that such a protrusion derived from this crystal structure is referred to as a micro-cone.

A main point of the technique described in Patent Literature 1 is to form, on the C$^-$ plane of an n-type semiconductor layer exposed by the removal of a growth substrate, a plurality of depressions arranged along crystal axes of the semiconductor material and then to subject the n-type semiconductor layer to wet etching with an alkali solution. Such a depression provided on the surface of the n-type semiconductor layer functions as an etching control point having a lower etching rate than the other surface portion of the n-type semiconductor layer in the wet etching, which is a post-processing step. According to the description, it is preferable that various crystal planes (fine facets) excluding the C$^-$ plane be exposed in the depression, e.g., the depression have a bowl-like, conical, or hemispherical shape in order for the depression to function as an etching control point (etching rate-limiting point).

A depression in which the C$^-$ plane is exposed over a large area fails to function as the etching control point. When a cylindrical depression is formed, for example, the bottom of such a depression also has the C$^-$ plane, thus having the same etching rate as the other surface portion. Therefore, such a depression fails to function as the etching control point (etching rate-limiting point).

Patent Literature 1 describes that the depression is formed by dry etching such as reactive ion etching. The inventor of the present application, however, has focused on the fact that it is difficult to control a shape and a depth of the depression as the above-described control point when dry etching is used. In other words, depressions in various shapes such as a columnar shape and a polygonal columnar shape are formed when the dry etching is used. Thus, it is difficult to form micro-cones arranged uniformly and regularly and having a uniform size.

Additionally, an etching rate in the most surface portion of the n-type semiconductor layer excluding the depressions remains random, thus destabilizing the process of forming the micro-cones in the etching.

The present invention has been made in view of the above-described circumstances. It is an object of the present invention to provide a high-intensity and highly-reliable semiconductor light-emitting element having regularly-arranged and uniformly-sized homogeneous protrusions and thus achieving high light extraction efficiency and a method of manufacturing such a semiconductor light-emitting element.

Solution to Problem

A method of manufacturing a semiconductor light-emitting element according to the present invention is a method of manufacturing a semiconductor light-emitting element including a semiconductor structure layer, the method including the steps of: forming, on a surface of the semiconductor structure layer, easily-to-be-etched portions arranged on the basis of crystal directions on the surface of the semiconductor structure layer; and subjecting the surface of the semiconductor structure layer to wet etching to form an uneven structure surface including a plurality of protrusions derived from a crystal structure of the semiconductor structure layer on the surface of the semiconductor structure layer.

A semiconductor light-emitting element according to the present invention is a semiconductor light-emitting element including a semiconductor structure layer having hexagonal crystal structure, wherein a surface of the semiconductor structure layer is a C$^-$ plane, and when the surface is subdivided in a mesh form, including equilateral-triangular lattices, by a first straight line group including a plurality of straight lines arranged in parallel with a [11-20] direction, from among crystal directions on the surface of the semiconductor structure layer, and at regular intervals, a second straight line group including a plurality of straight lines arranged in parallel with a [2-1-10] direction and at the same interval as the first straight line group, and a third straight line group including a plurality of straight lines arranged in parallel with a [1-210] direction and at the same interval as the first and second straight line groups, the surface of the semiconductor structure layer has an uneven surface structure including hexagonal pyramid-shaped protrusions each having bases of a regular hexagon having a center at vertex of the equilateral-triangular lattice and a side edge portion of each of the protrusions has a depressed structure.

DESCRIPTION OF EMBODIMENTS

A method of manufacturing a semiconductor light-emitting element according to an embodiment of the present invention has features in that a hard-to-be-etched portion having a relatively small etching rate and easily-to-be-etched portions having a relatively large etching rate are formed on a C⁻ plane, i.e., the surface on the N-polar side (N-polar surface), of GaN having a hexagonal crystal structure, for example, and then these portions are subjected to wet etching. Its details will be described below.
First Embodiment FIGS. 1(a) to 1(d) are cross-sectional views for explaining a method of manufacturing a semiconductor light-emitting element according to the first embodiment of the present invention. For ease of explanation and understanding, a description will be given of a portion including two adjacent semiconductor light-emitting elements 10 in a semiconductor wafer.

Figure 1A:
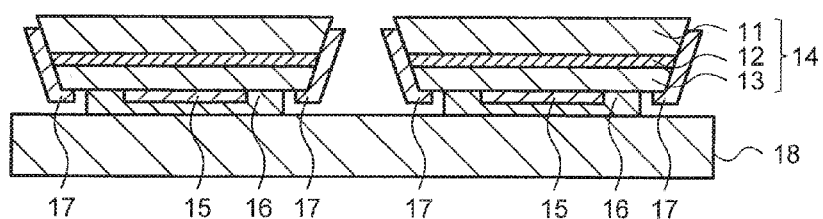
FIGS. 1(a) to 1(d) are cross-sectional views for explaining respective steps in a method of manufacturing a semiconductor light-emitting element according to a first embodiment.

FIG. 1(a) is a cross-sectional view for explaining steps of fabricating a GaN-based semiconductor light-emitting element having the bonded structure. First, an n-type semiconductor layer (first semiconductor layer) 11, an active layer 12, and a p-type semiconductor layer (second semiconductor layer) 13 each having a composition of $Al_xIn_yGa_zN$ ($0 \le x \le 1$, $0 \le y \le 1$, $0 \le z \le 1$, and $x+y+z=1$) are sequentially grown on a growth substrate (not shown) that is a substrate used for crystal growth. The n-type semiconductor layer 11, the active layer 12, and the p-type semiconductor layer 13 are collectively referred to as a semiconductor structure layer 14. Metal organic chemical vapor deposition (MOCVD) was used for the growth of the semiconductor structure layer 14.

In this embodiment, a buffer layer (not shown), the n-GaN layer 11, the quantum well active layer 12 formed of an InGaN layer/GaN layer, a p-AlGaN cladding layer (not shown), and the p-GaN layer 13 were sequentially grown on a sapphire substrate with a crystal growth surface being a C-minus plane (C⁻ plane).

Next, a p-electrode 15 is formed on the p-type semiconductor layer 13. A sputtering technique and an electron beam deposition technique, for example, may be used to form the p-electrode 15. In this embodiment, a patterned mask (not shown) was formed on the p-type semiconductor layer 13, and then a Ni layer, an Ag layer, and a Ni layer were sequentially formed by the electron beam deposition technique. The mask was then removed by a lift-off technique to form the p-electrode 15.

Subsequently, a metal layer 16 is formed so as to cover the entire p-electrode 15. The metal layer 16 includes a cap layer (not shown) for preventing the migration of the material(s) of the p-electrode 15 and a bonding layer (not shown) used for bonding with a later-described support substrate. A metal material such as Ti, TiW, Pt, Ni, Au, AuSn, or Cu may be used as a material of the metal layer 16. The sputtering technique and the electron beam deposition technique, for example, may be used to form the metal layer 16. In this embodiment, a Ti layer, a Pt layer, and an AuSn layer were formed so as to cover the entire p-electrode 15.

Next, the semiconductor structure layer 14 is divided into elements, and then a protective film 17 is formed on a side portion of such a divided semiconductor structure layer 14. The sputtering technique was used to form the protective film 17. An insulating material such as $SiO_2$ or SiN may be used as a material of the protective film 17. In this embodiment, an $SiO_2$ film was formed on the side portion of the semiconductor structure layer 14.

Subsequently, a support substrate 18 is separately prepared, and the support substrate 18 is bonded to the semiconductor structure layer 14 via the metal layer 16. A known material such as an Si substrate having a surface with a metal layer (not shown) such as AuSn or Au or a plated Cu alloy may be used as a material of the support substrate 18. Thermocompression bonding was used to bond the semiconductor structure layer 14 and the support substrate 18 together. In this embodiment, the Si substrate 18 including an AuSn layer formed thereon and the metal layer 16 formed on the semiconductor structure layer 14 side were bonded together by means of heating and compression bonding.

Subsequently, the growth substrate used for growing the semiconductor structure layer 14 is removed from the semiconductor structure layer 14. A laser lift-off technique was used to remove the growth substrate. In this embodiment, a KrF excimer laser was used to irradiate the sapphire substrate, thereby peeling off the sapphire substrate from the n-GaN layer 11. The removal of the sapphire substrate results in the exposure of the C⁻ plane of the n-GaN layer 11, i.e., the N-polar surface of GaN.

Figure 1B:
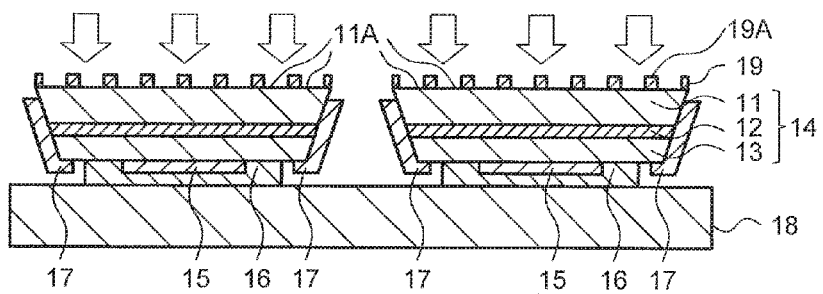

Next, easily-to-be-etched portions are formed on the surface of the n-type semiconductor layer 11 as shown in FIG. 1(b). Specifically, a mask layer 19, including a plurality of mask portions 19A that are arranged on the basis of crystal directions on the surface of the n-type semiconductor layer 11, is first formed on the n-type semiconductor layer 11. A photoresist, for example, may be used as a material of the mask layer 19. In this embodiment, the mask layer 19, including the circular mask portions 19A each having a diameter of 300 nm, was formed on the surface of the n-GaN layer 11. Specifically, a resist layer was first applied over the entire surface of the n-GaN layer 11, and then prebaking was performed thereto with a hot plate. Next, the photoresist was exposed with UV light so as to obtain the above-described pattern. Subsequently, the wafer was immersed into a developing solution to develop the pattern.

Subsequently, a surface 11A of the n-type semiconductor layer 11 that is exposed from the mask layer 19 was subjected to plasma irradiation with an inert gas. An Ar gas, for example, may be used as a material of such an inert gas. A sputtering apparatus and a dry etching apparatus, for example, may be employed for the plasma irradiation. In this embodiment, the exposed portion 11A of the n-GaN layer 11 was irradiated with Ar gas plasma for about 5 minutes with the use of a reverse sputtering function of the sputtering apparatus. Although the Ar gas plasma was used in this embodiment, a similar effect can be obtained also when plasma of a different inert gas such as He, Ne, Kr, Xe, or Rn is used.

A portion that has been irradiated with plasma (hereinafter referred to as a plasma-irradiated portion), i.e., the portion 11A exposed from the mask layer 19 on the surface of the n-GaN layer 11 has a relatively small rate etching, which is a downstream step. In contrast, portions that have not been irradiated with plasma (hereinafter referred to as plasma-unirradiated portions), i.e., portions corresponding to the formation positions of the mask portions 19A of the mask layer 19 on the surface of the n-GaN layer 11 have a relatively large etching rate. In other words, the plasma-unirradiated portion is the easily-to-be-etched portion, whereas the plasma-irradiated portion is the hard-to-be-etched portion. The details of the surface of the n-type semiconductor layer 11 and the mask layer 19 will be described later with reference to FIG. 2.

Figure 1C:
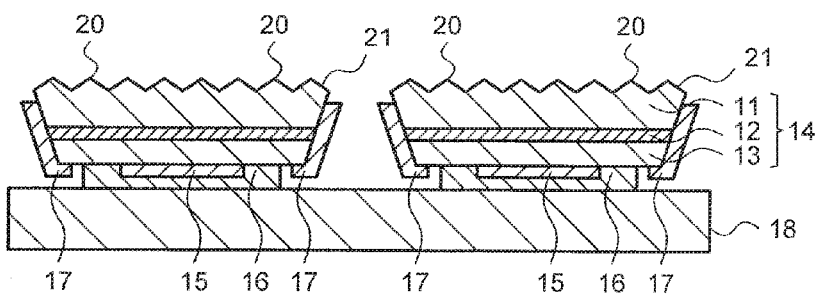

Next, after the mask layer 19 was removed with an organic solvent, the surface of the n-type semiconductor layer 11 was wet-etched with an alkali solution as shown in FIG. 1(c). Specifically, the semiconductor wafer was immersed into an alkali solution such as TMAH (tetramethylammonium solution) and KOH (potassium hydroxide solution), for example. In this embodiment, the wafer was immersed into TMAH at about 70° C. Consequently, a plurality of hexagonal pyramid-shaped protrusions, i.e., micro-cones 20 arranged according to the arrangement configuration of the portions where the mask portions 19A of the mask layer 19 were formed (easily-to-be-etched portions) and derived from the crystal structure of the n-type semiconductor layer 11 were formed on the surface of the n-type semiconductor layer 11. In this manner, an uneven structure surface 21 including the plurality of protrusions 20 are formed on the surface of the n-type semiconductor layer 11.

Figure 1D:
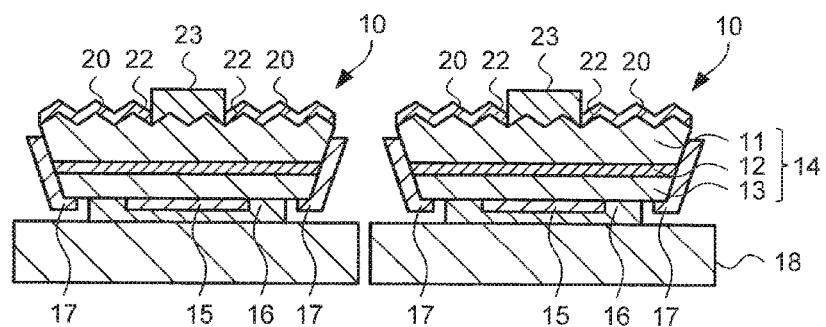

Subsequently, a protective layer 22 was formed on the surface of the n-type semiconductor layer 11 as shown in FIG. 1(d). Insulating materials such as $SiO_2$ and SiN, for example, may be used as materials of the protective layer 22. The sputtering technique was used to form the protective layer 22. Note that there is no need to form the protective layer 22 at a portion where a later-described n-electrode 23 is to be formed.

Next, the n-electrode 23 is formed on the surface of the n-type semiconductor layer 11. The sputtering technique and the electron beam deposition technique, for example, may be used to form the n-electrode 23. In this embodiment, a portion where no protective layer 22 is to be formed was first provided on the surface of the n-type semiconductor layer 11. A patterned mask (not shown) was then formed on the n-type semiconductor layer 11. After Ti layer, an Al layer, a Ti layer, a Pt layer, and an Au layer were sequentially formed by the electron beam deposition technique, the mask was removed by the lift-off technique to form the n-electrode 23. Thereafter, the support substrate 18 is divided in units of an element to obtain the semiconductor light-emitting elements 10.

Figure 2A:
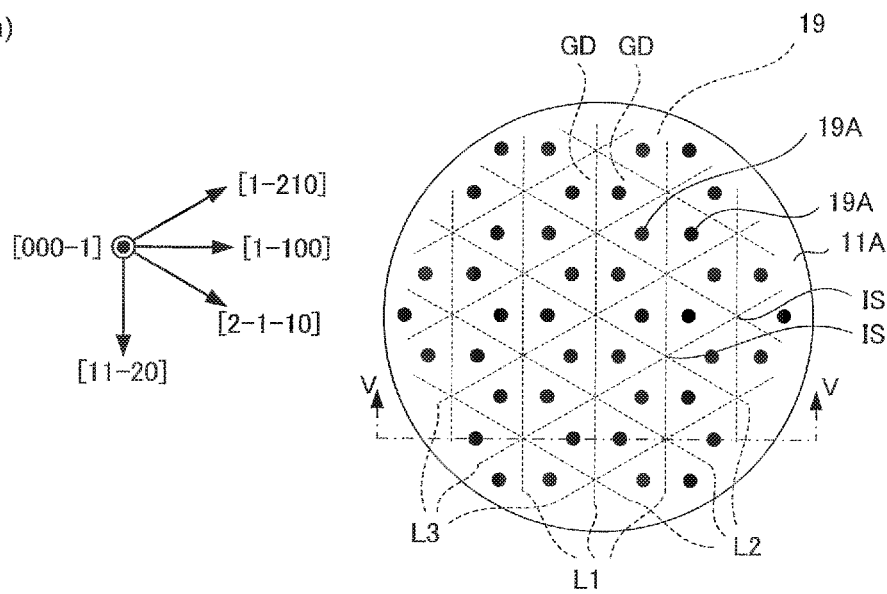
FIGS. 2(a) and 2(b) are diagrams for explaining arrangement configurations for mask portions of a mask layer formed in the first embodiment.
Figure 2B:
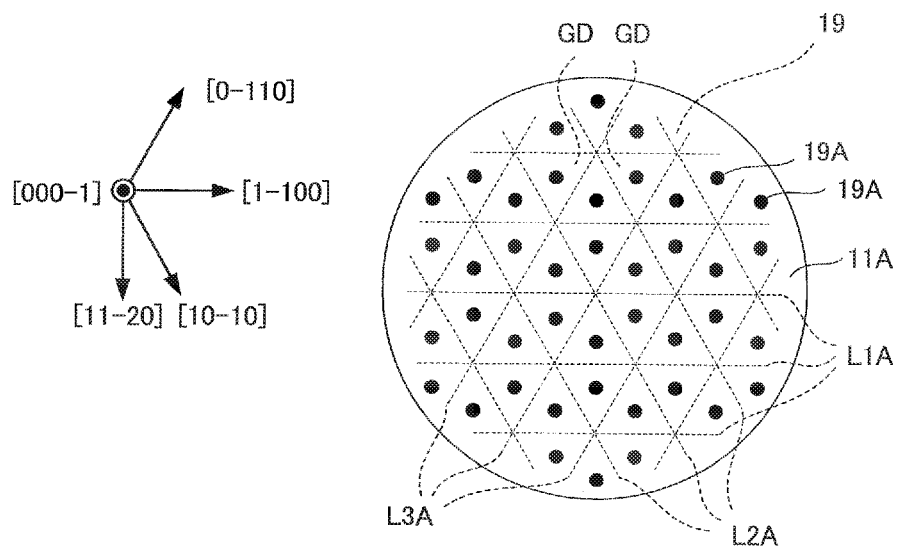

The mask layer 19 for forming the easily-to-be-etched portions and the hard-to-be-etched portion will be described in detail with reference to FIGS. 2(a) and 2(b). FIGS. 2(a) and 2(b) are top views of the n-type semiconductor layer 11 (semiconductor structure layer 14). Broken lines in the figures indicate straight lines parallel to crystal directions on the surface of the n-type semiconductor layer 11.

In this embodiment, the mask portions 19A of the mask layer 19 were formed in a dotted arrangement configuration as shown in FIG. 2(a). More specifically, when the surface of the n-type semiconductor layer 11 is subdivided in a mesh form, including equilateral-triangular unit lattices (unit grids or unit cells, hereinafter referred to simply as lattices) GDs, by a first group subdividing lines (first straight line group) L1 including a plurality of straight lines arranged in parallel with the [11-20] direction, from among the crystal directions on the surface of the n-type semiconductor layer 11, and at regular intervals, a second group of subdividing lines (second straight line group) L2 including a plurality of straight lines arranged in parallel with the [2-1-10] direction and at the same interval as the first group of subdividing lines L1, and a third group of subdividing lines (third straight line group) L3 arranged in parallel with the [1-210] direction and at the same interval as the first and second groups of subdividing lines L1 and L2, each mask portion 19A is formed at the center of such an equilateral-triangular lattice GD.

Specifically, a plurality of straight lines arranged in parallel with the [11-20] direction, from among the crystal directions on the surface of the n-type semiconductor layer 11, and at regular intervals are first determined on the surface of the n-type semiconductor layer 11. These straight lines are collectively referred to as the first straight line group L1. Similarly, pluralities of straight lines arranged respectively in parallel with the [2-1-10] direction and the [1-210] direction and at the same interval as the first straight line group L1 are determined, and these pluralities of straight lines are collectively referred to as the second straight line group L2 and the third straight line group L3, respectively. Here, the arrangement of the straight lines is determined (defined) so that three straight lines, each selected from each straight line group, intersect at one point (intersection point IS). This causes the surface of the n-type semiconductor layer 11 to be subdivided in a mesh form by the plurality of equilateral-triangular lattices GDs each having vertices at the intersection points ISs of the straight lines groups. The surface of the n-type semiconductor layer 11 is subdivided in a mesh form by the equilateral-triangular unit lattices GDs having the same shape.

The mask portion 19 is formed at the center of each of the plurality of equilateral-triangular lattices GDs. The easily-to-be-etched portion is the plasma-unirradiated portion on the surface of the n-type semiconductor layer 11 corresponding to the position at which the mask portion 19A is formed. In this embodiment, the interval between the straight lines in each straight line group was set in a range of about 0.7 to about 1.5 μm, and where to arrange the mask portions 19A was determined accordingly.

In other words, when the surface of the n-type semiconductor layer 11 is subdivided in a mesh form, including the equilateral-triangular lattices GDs, by the first straight line group L1, the second straight line group L2, and the third straight line group L3, the mask portions 19A of the mask layer 19 are formed so as constitute vertex portions of a regular hexagon having its center at a vertex of such a lattice GD (i.e., the intersection point IS of the straight line groups).

As shown in FIG. 2(b), the mask portion 19A of the mask layer 19 may alternatively be formed at the center of each of unit lattices GDs provided by subdividing the surface of the n-type semiconductor layer 11 in a mesh form by a first straight line group L1A including a plurality of straight lines arranged in parallel with the [1-100] direction, from among the crystal directions on the surface of the n-type semiconductor layer 11, and at regular intervals, a second straight line group L2A including a plurality of straight lines arranged in parallel with the [10-10] direction and at the same interval as the first straight line group L1A, and a third straight line group L3A including a plurality of straight lines arranged in parallel with the [0-110] direction and at the same interval as the first straight line group L1A and the second straight line group L2A.

Note that the crystal directions on the surface of the semiconductor structure layer 14 (n-type semiconductor layer 11) can be grasped, for example, on the basis of a cutout called an orientation flat (OF) typically provided in a growth substrate and indicating a crystal direction. The arrangement configuration of the mask portions shown in FIG. 2(b) corresponds to the one obtained by rotating the arrangement configuration of the mask portions shown in FIG. 2(a) by 90 degrees.

Figure 3A:
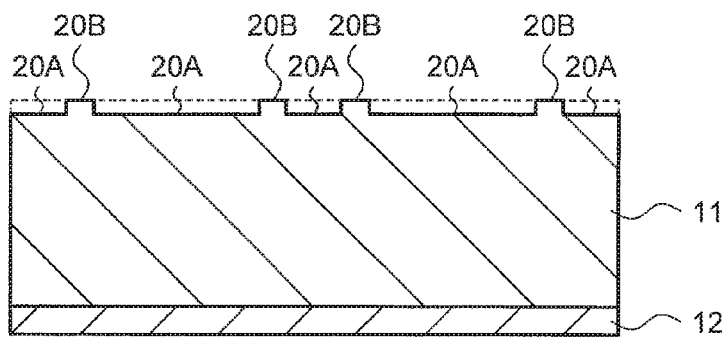
FIGS. 3(a) to 3(d) are cross-sectional views for explaining a process of forming protrusions in a wet etching step of the first embodiment.
Figure 3B:
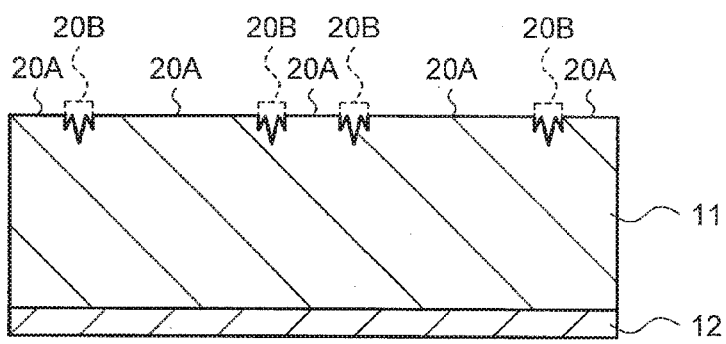
Figure 3C:
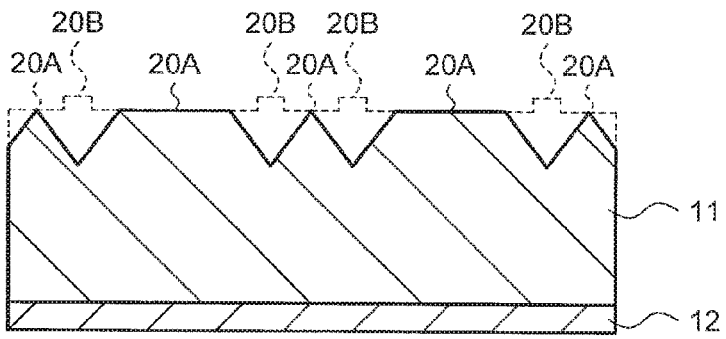
Figure 3D:
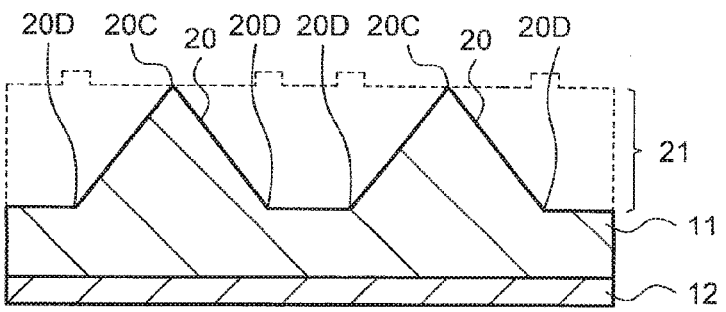
Figure 4:
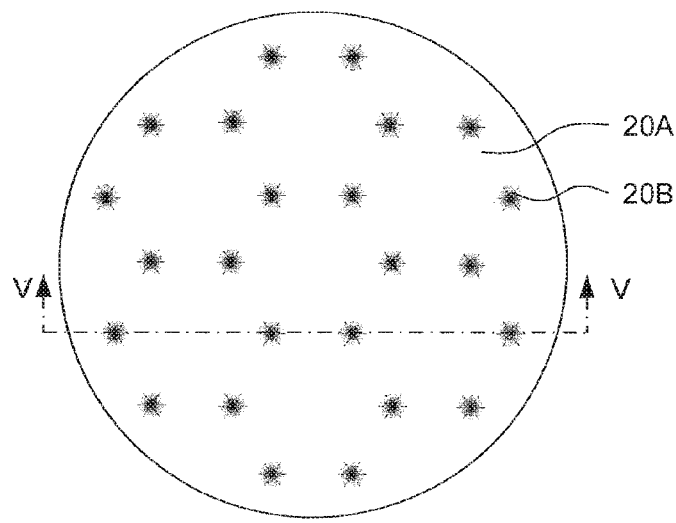
FIGS. 4(a) to 4(c) are diagrams each illustrating a surface of an n-type semiconductor layer in the wet etching step of the first embodiment.
Figure 4:
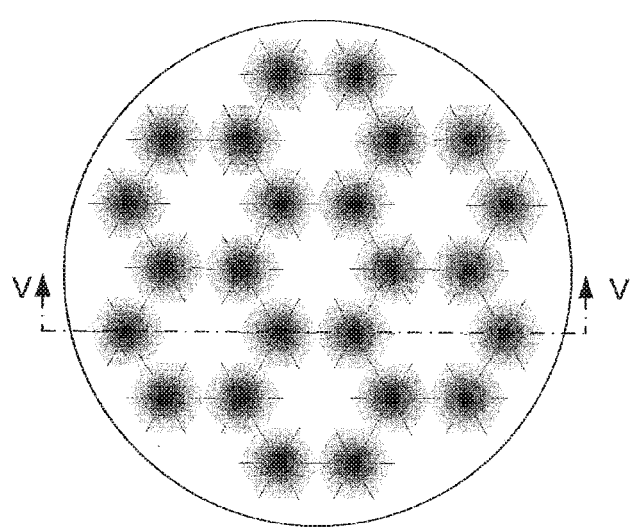
Figure 4:
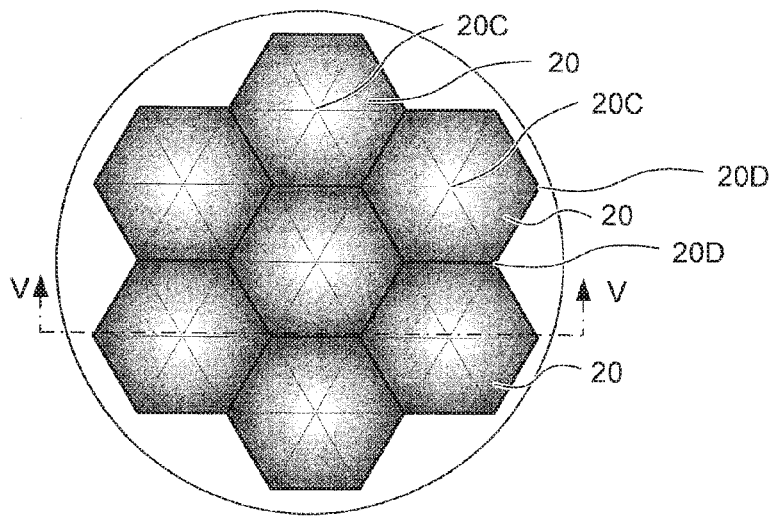

FIGS. 3(a) to 3(d) and FIGS. 4(a) to 4(c) are diagrams for explaining the process of forming the uneven structure surface 21 through the formation of the protrusions 20 in the wet etching step of FIG. 1(c). FIGS. 3(a) to 3(d) are cross-sectional views taken along the line V-V in FIG. 2(a) and illustrating the process of forming the protrusions 20. FIGS. 4(a) to 4(c) are top views schematically illustrating the surface of the n-type semiconductor layer 11 during the process of forming the micro-cones. The line V-V in FIGS. 4(a) to 4(c) corresponds to the line V-V in FIG. 2(a). Hereinafter, a plasma-irradiated portion on the surface of the n-type semiconductor layer 11, which is the hard-to-be-etched portion, is referred to as a plasma-irradiated portion 20A, A plasma-unirradiated portion on the surface of the n-type semiconductor layer 11, which corresponds to the portion under the mask portion 19A and is the easily-to-be-etched portion, is referred to as a plasma-unirradiated portion 20B.

FIG. 3(a) is a cross-sectional view illustrating, in an enlarged scale, the surface of the n-type semiconductor layer 11 after the removal of the mask layer 19 following the plasma irradiation step. The plasma-irradiated portion 20A is depressed more when compared with the other surface portion, i.e., the plasma-unirradiated portion 20B. The bottom of such a depression has a flat surface parallel to the other surface portion, which is the C⁻ plane. Moreover, such a depression is extremely shallow and has a depth of smaller than, for example, 50 nm, and preferably in a range of 30 to 40 nm. Note that the plasma-irradiated portion needs not be depressed as long as it is formed as the hard-to-be-etched portion.

Once the wet etching is started, small facets start to form on a surface of the plasma-unirradiated portion 20B as shown in FIG. 3(b). At this point, no etching proceeds in the plasma-irradiated portion 20A. A schematic view illustrating the surface of the n-type semiconductor layer 11 in such a state, as viewed from the top surface of the element, is shown in FIG. 4(a).

As the etching further proceeds, the plasma-unirradiated portion 20B continues to be etched away as shown in FIG. 3(c). Additionally, an etchant goes under the plasma-irradiated portion 20A from the plasma-unirradiated portion 20B, and thus etching (also referred to as side etching) proceeds so as to get under the plasma-irradiated portion 20A. A schematic view illustrating the surface of the n-type semiconductor layer 11 in such a state, as viewed from the top surface of the element, is shown in FIG. 4(b).

As the etching further proceeds, the hexagonal pyramid-shaped protrusion 20 having a vertex 20C at the intersection point IS of the straight line groups, i.e., a point farthest away from the plasma-irradiated portion 20A is formed as shown in FIG. 3(d). Moreover, the bottom face of the thus formed protrusion 20 has a regular hexagonal shape having vertices 20D at portions corresponding to the plasma-unirradiated portions 20B. The protrusions 20 have the uniform shape and are formed in a closest-packed arrangement on the surface of the n-type semiconductor layer 11. A schematic view illustrating the surface of the n-type semiconductor layer 11 in such a state, i.e., the uneven structure surface 21, as viewed from the top surface of the element, is shown in FIG. 4(c). In this manner, the uneven structure surface 21 including the hexagonal pyramid-shaped protrusions 20 is formed on the surface of the semiconductor structure layer 14. Note that the closest-packed arrangement refers to an arrangement in which the plurality of micro-cones 20 each having a regular hexagonal bottom face are arranged without any gap therebetween on a planar surface, i.e., refers to what is called a honeycomb arrangement as shown in FIG. 4(c).

In this embodiment, the easily-to-be-etched portions 20B are formed in a dotted manner on the surface of the n-type semiconductor layer 11, and the hard-to-be-etched portion 20A, in which the etching is relatively hard to proceed, is formed over the other surface portion of the n-type semiconductor layer 11. Thereafter, the etching is performed. This allows the protrusions 20 to be formed on the C⁻ plane of the n-type semiconductor layer 11 in a stable manner in the etching. Thus, the uneven structure surface 21 including the protrusions 20 having the uniform shape and disposed in the closest-packed arrangement can be formed in a highly reliably manner. This allows light to be extracted in a greater amount from the surface of the n-type semiconductor layer 11, i.e., the light extraction surface 21. Thus, the semiconductor light-emitting element having high intensity, high reliability, and high light extraction efficiency can be provided.

Figure 5:
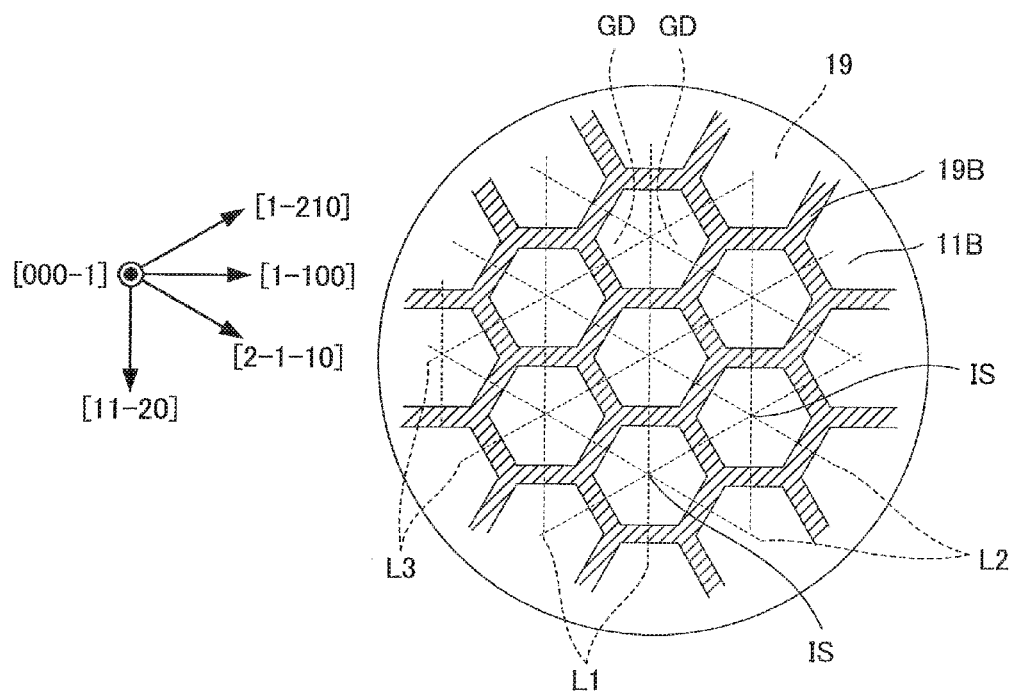
FIG. 5 is a diagram illustrating a surface of an n-type semiconductor layer and a mask layer according to a modified example of the first embodiment.

FIG. 5 is a diagram for explaining a step of forming easily-to-be-etched portions in the method of manufacturing a semiconductor light-emitting element according to a modified example of this embodiment. FIG. 5 shows a top view of an n-type semiconductor layer 11 with a mask layer for forming the easily-to-be-etched portions in this modified example. For ease of understanding, mask portions 19B of a mask layer 19 are hatched.

The method of manufacturing a semiconductor light-emitting element according to this modified example has steps similar to those in the method of manufacturing a semiconductor light-emitting element according to the first embodiment except for the step of forming easily-to-be-etched portions. This modified example differs in a shape of the mask portions 19B of the mask layer 19 in the step of forming easily-to-be-etched portions as well as patterns of surface portions 11B of the n-type semiconductor layer 11 exposed from the mask portions 19B and the easily-to-be-etched portions to be formed.

As shown in FIG. 5, the mask portions 19B of the mask layer 19 in this modified example have a honeycomb pattern. Specifically, when a surface is subdivided in a mesh form, including equilateral-triangular lattices GDs, by a first straight line group L1 including a plurality of straight lines arranged in parallel with the [11-20] direction, from among crystal directions on the surface of the semiconductor structure layer 14, and at regular intervals, a second straight line group L1 including a plurality of straight lines arranged in parallel with the [2-1-10] direction and at the same interval as the first straight line group L1, and a third straight line group L3 including a plurality of straight lines arranged in parallel with the [1-210] direction and at the same interval as the first and second straight line groups L1 and L2, the mask portions 19B are formed so as to each constitute sides of a regular hexagon having its center at a vertex of such a lattice GD and thus obtain a honeycomb pattern.

The mask portions 19B of this modified example correspond to a configuration obtained by connecting one mask portion 19A of the first embodiment and its adjacent (closest in distance) three mask portions 19A with straight lines. In other words, the mask portions 19B of this modified example (i.e., portions to be the easily-to-be-etched portions) have a honeycomb pattern obtained by connecting one mask portion 19A of the first embodiment and the most adjacent mask portions 19A thereto with straight lines.

Also in this modified example, as with this embodiment, the surface of the semiconductor structure layer 14 may be subdivided in a mesh form, including equilateral-triangular lattices GDs, by a first straight line group L1A including a plurality of straight lines arranged in parallel with the [1-100] direction, from among the crystal directions on the surface of the semiconductor structure layer 14, and at regular intervals, a second straight line group L2A including a plurality of straight lines arranged in parallel with the [10-10] direction and at the same interval as the first straight line group L1A, and a third straight line group L3A including a plurality of straight lines arranged in parallel with the [0-110] direction and at the same interval as the first and second straight line groups L1A and L2A, and the mask portions 19B may be formed accordingly.

Figure 6A:
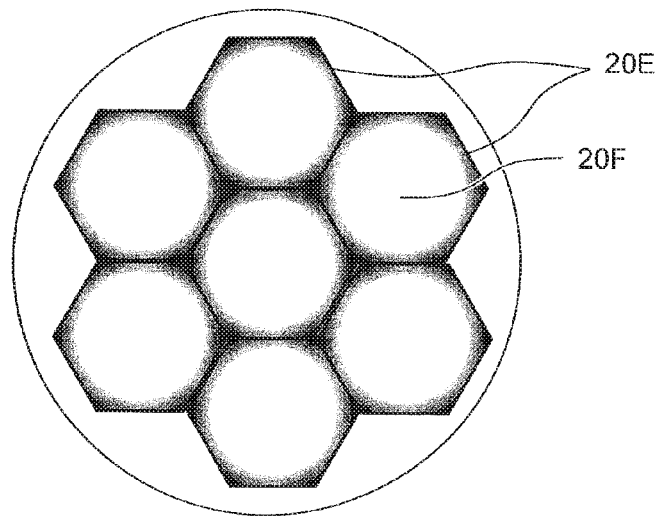
FIGS. 6(a) to 6(c) are diagrams each illustrating a surface of the n-type semiconductor layer in a wet etching step in the variation of the first embodiment.
Figure 6B:
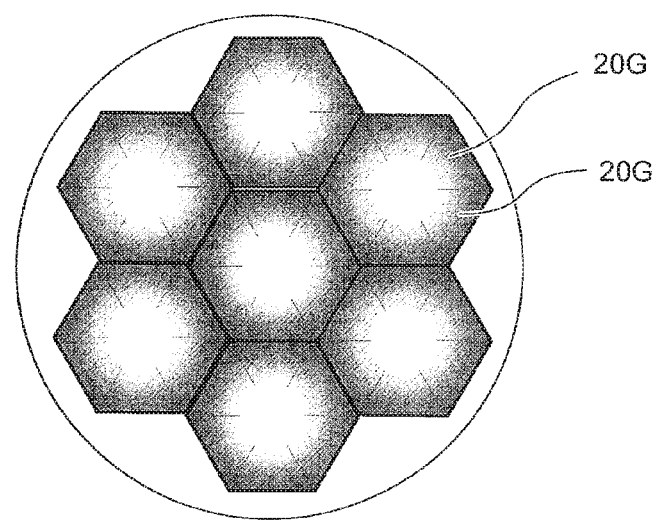
Figure 6C:
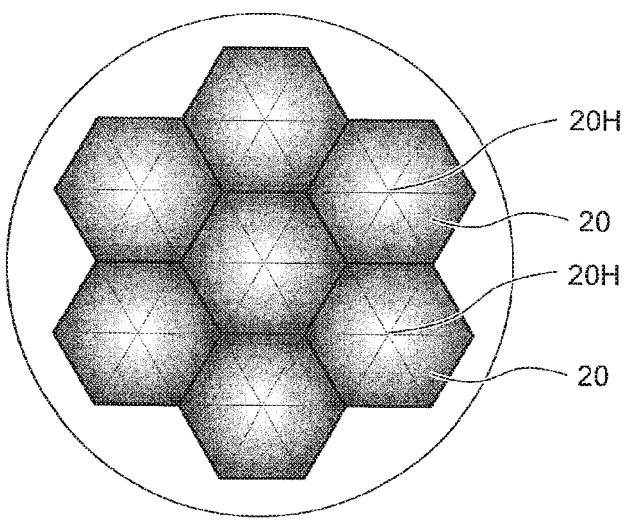

FIGS. 6(a) to 6(c) are diagrams for explaining a process of forming micro-cones in an etching step of this modified example. FIGS. 6(a) to 6(c) are top views schematically illustrating the surface of the n-type semiconductor layer 11 in the etching step in chronological order.

In this modified example, once the etching is started, the etching proceeds so as to go under a hard-to-be-etched portion, i.e., a plasma-irradiated portion 20F from a plasma-unirradiated portion (easily-to-be-etched portion) 203 corresponding to the mask portion 193 as shown in FIG. 6(a). Since the plasma-unirradiated portions 20E are formed in a honeycomb shape, the etching proceeds radially from bent portions of the plasma-unirradiated portion 20E, i.e., intersection points with its adjacent plasma-unirradiated portions 20E, and the etching proceeds linearly from straight line portions of the plasma-unirradiated portion 20E. Thus, the etching proceeds so as to form a generally circular shape from the plasma-unirradiated portion 20E.

As the etching proceeds, a side surface portion 20G of the micro-cone, i.e., crystal planes (facets) other than the C⁻ plane start to form as shown in FIG. 6(b). Once the C⁻ plane is eliminated by etching, the etching drastically becomes hard to proceed. Thus, once the side surface portion 20G is formed as a result of the progress of the etching, no etching proceeds further.

Eventually, a hexagonal pyramid-shaped protrusion 20 with a bottom face in the shape of a regular hexagon having the plasma-unirradiated portion 20E as its sides and with a top vertex 20H above an intersection point of the straight line groups, which is the center of the plasma-irradiated portion 20F, is formed as shown in FIG. 6(c). In this manner, an uneven structure surface 21 including the hexagonal pyramid-shaped protrusions 20 is formed on the surface of the semiconductor structure layer 14.

In this modified example, the easily-to-be-etched portions 20E are formed in a honeycomb shape. The easily-to-be-etched portion 20E in this modified example has a larger area than the dot-shaped easily-to-be-etched portion 20B in the first embodiment. This allows the formation of the protrusions 20, i.e., the uneven structure surface 21 in a short period of etching time.

Figure 7A:
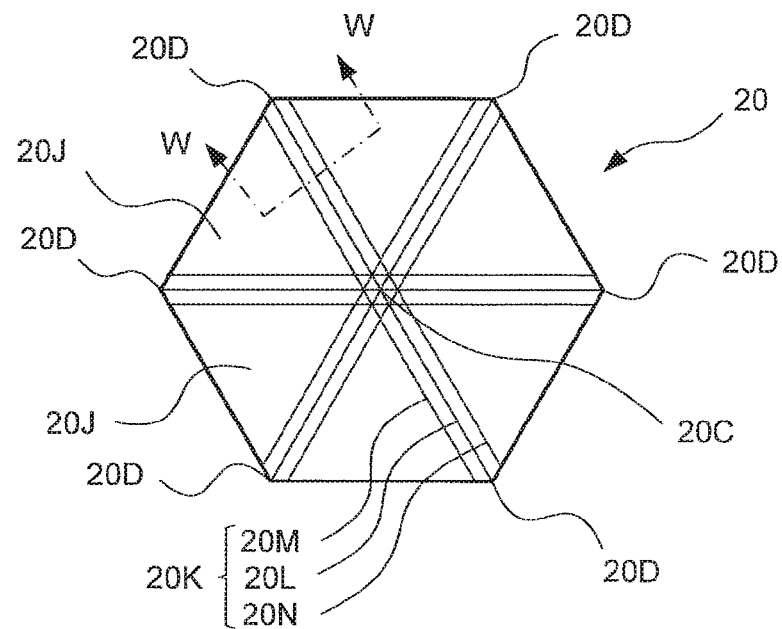
FIGS. 7(a) and 7(b) are diagrams for explaining the details of a protrusion formed in the embodiment.
Figure 7B:
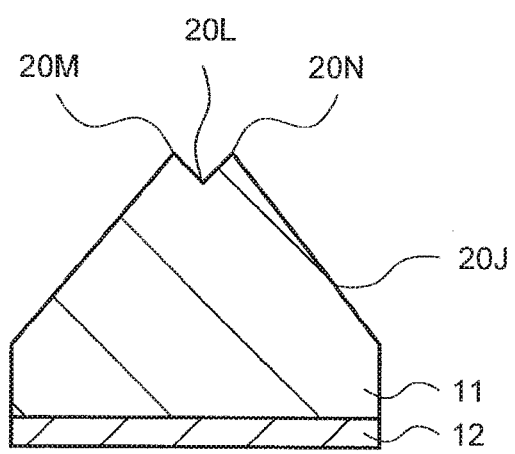

FIGS. 7(a) and 7(b) are diagrams for explaining a detailed shape of the protrusion 20 formed on the light extraction surface (i.e., the C⁻ plane of the semiconductor structure layer 14) 21 of the semiconductor light-emitting element 10 fabricated according to the method of manufacturing a semiconductor light-emitting element in this embodiment. FIG. 7(a) is an enlarged view of the protrusion 20 as viewed from above. FIG. 7(b) is a cross-sectional view taken along the line W-W in FIG. 7(a).

As described above, the surface of the semiconductor structure layer 14 has the uneven surface structure including the hexagonal pyramid-shaped protrusions 20. Moreover, when the surface of the semiconductor structure layer 14 is subdivided in a mesh form, including the equilateral-triangular unit lattices GDs, by the straight line groups L1 to L3, the protrusion 20 has a hexagonal pyramid shape with bases of a regular hexagon having a center at a vertex of such a unit lattice GD. Specifically, the position of the top vertex 20C of such a hexagonal pyramid-shaped protrusion 20 corresponds to the position of the intersection point of the straight line groups as viewed from above, i.e., the position of the vertex of the unit lattice GD as shown in FIG. 7(a). Moreover, the bottom face of the protrusion 20 has a regular hexagonal shape having the vertices 20D at the portions corresponding to the easily-to-be-etched portions 20B.

As shown in FIGS. 7(a) and 7(b), a side edge portion (lateral edge portion) 20K of the protrusion 20 has a depressed structure (valley structure). Six side surfaces (i.e., pyramidal surfaces of the hexagonal pyramid) 20J of the protrusion 20 each have an isosceles triangular shape, and their vertex portions together form the vertex 20C of the protrusion 20. An equilateral portion of the side surface 20J of the protrusion 20 is in contact with an equilateral portion of its adjacent side surface 20J via the side edge portion 20K having the depressed structure. Moreover, the side edge portion 20K of the protrusion 20 has a structure in which a valley portion (depression) 20L is interposed between peak portions (protrusions) 20M and 20N as shown in FIG. 7(b).

Second Embodiment

Figure 8:
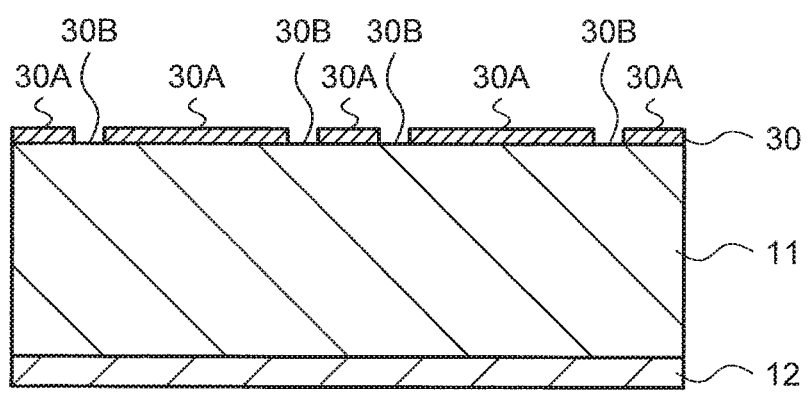
FIG. 8 is a diagram for explaining a step of forming easily-to-be-etched portions according to a second embodiment.

FIG. 8 is a diagram for explaining a step of forming easily-to-be-etched portions in a method of manufacturing a semiconductor light-emitting element according to a second embodiment. The method of manufacturing a semiconductor light-emitting element according to the second embodiment has steps similar to those in the method of manufacturing a semiconductor light-emitting element according to the first embodiment except for the step of forming easily-to-be-etched portions. FIG. 8 is a cross-sectional view illustrating a surface of an n-type semiconductor layer 11 after the step of forming easily-to-be-etched portions in this embodiment, corresponding to FIG. 3(a), which is the diagram showing the state after the step of forming easily-to-be-etched portions in the first embodiment.

This embodiment is characterized in that a metal film 30 having an opening pattern including a plurality of openings 30B is formed on the surface (C⁻ plane) of the n-type semiconductor layer 11 in the step of forming easily-to-be-etched portions. In this embodiment, Ag was used, as a material of the metal film 30. The sputtering technique was used to form the metal film 30. The openings 30B of the metal film 30 were formed in an arrangement configuration similar to the plasma-unirradiated portions 20B in the first embodiment by, for example, photolithography.

In this embodiment, the hard-to-be-etched portion is a portion 30A of the metal film 30 where a metal material is formed, and the easily-to-be-etched portion is a portion of the n-type semiconductor layer 11 exposed from the opening 30B in the metal film 30. Moreover, the easily-to-be-etched portions are formed in a pattern of dots.

In this embodiment, a metal material is used to form the hard-to-be-etched portion. In this case, almost no etching proceeds in the hard-to-be-etched portion. Thus, etching in this embodiment proceeds only from the easily-to-be-etched portions (the exposed portions of the n-type semiconductor layer) in the etching step. This requires longer etching time than in the first embodiment, but still can solve the problem of stable formation of protrusions as with the first embodiment.

Although this embodiment has described the case employing Ag as a material of the metal film 30, the material of the metal film 30 is not limited to Ag. For example, a material such as Pt, Ti, or Au may be used, in place of Ag, as a material of the metal film. Moreover, although the case employing the sputtering technique for the formation of the metal film has been described, a forming method such as the electron beam deposition technique, for example, may be used to form the metal film.

Moreover, although this embodiment has described the case in which a metal material is used to form the hard-to-be-etched portion, such formation is not limited to employing a metal material. For example, an insulating film made of an insulating material such as $SiO_2$ or SiN or a resin film such as polyimide may be formed in place of the metal film 30 to form the hard-to-be-etched portion.

Moreover, although this embodiment has described the case in which the metal film 30 having the dotted openings 30B (i.e., portions to be the easily-to-be-etched portions) is formed, a metal film having a honeycomb pattern may be formed as with the modified example of the first embodiment.

Although the above-described embodiment has described the case in which the circular easily-to-be-etched portions are formed in a pattern of dots, the shape of the dotted easily-to-be-etched portions is not limited to a circle. For example, the easily-to-be-etched portion may have a polygonal shape or an elliptical shape.

Moreover, although the case in which the diameter of the dotted easily-to-be-etched portion 20B is 300 nm has been described, the diameter of the easily-to-be-etched portion 20B is not limited to 300 nm. In view of the controllability of a shape and a size of the micro-cone, the easily-to-be-etched portion 20B preferably has a diameter in a range of 50 to 1000 nm. This is because the etching rate significantly slows down if the diameter of the easily-to-be-etched portion 20B is smaller than 50 nm, for example, and the micro-cones may be formed unstably if the diameter of the easily-to-be-etched portion 20B is larger than 1000 nm.

Moreover, although the above-described embodiment has described the case about the GaN-based semiconductor light-emitting element having the hexagonal crystal structure, the present invention can be similarly applied to methods of manufacturing other crystal-based semiconductor light-emitting elements.

As described above, the method of manufacturing a semiconductor light-emitting element according to this embodiment includes: the step of forming, on the surface of the semiconductor structure layer, the easily-to-be-etched portions arranged on the basis of the crystal directions on the surface of the semiconductor structure layer; and the step of subjecting the surface of the semiconductor structure layer to the wet etching to form the uneven structure surface including the plurality of protrusions derived from the crystal structure of the semiconductor structure layer on the surface of the semiconductor structure layer.

Thus, the regularly-arranged and uniformly-sized protrusions can be formed uniformly and stably, thereby making it possible to provide a high-intensity semiconductor light-emitting element with high light extraction efficiency. Moreover, a highly-reliable semiconductor light-emitting element can be provided by preventing deterioration in reliability due to the excessive progress of etching or the occurrence of leakage current, for example.

REFERENCE SIGNS LIST 10 semiconductor light-emitting element
14 semiconductor structure layer
20B, 30B easily-to-be-etched portion
20 protrusion
21 uneven structure surface
L1, L1A first straight line group
L2, L2A second straight line group
L3, L3A third straight line group
GD unit lattice

The invention claimed is:

1. A method of manufacturing a semiconductor light-emitting element including a semiconductor structure layer having a hexagonal crystal structure, the method comprising:
    forming, on a C⁻ plane of the semiconductor structure layer, easily-to-be-etched portions which are arranged discretely based on crystal directions on the C⁻ plane of the semiconductor structure layer; and
    subjecting the C⁻ plane of the semiconductor structure layer to wet etching to form an uneven structure surface including a plurality of protrusions derived from the crystal structure of the semiconductor structure layer on the C⁻ plane of the semiconductor structure layer,
    wherein:
    when the C⁻ plane is subdivided in a mesh form, including equilateral-triangular lattices, by a first straight line group including a plurality of straight lines arranged in parallel with a [11-20] direction, from among the crystal directions on the C⁻ plane of the semiconductor structure layer, and at regular intervals, a second straight line group including a plurality of straight lines arranged in parallel with a [2-1-10] direction and at the same intervals as the first straight line group, and a third straight line group including a plurality of straight lines arranged in parallel with a [1-210] direction and at the same intervals as the first and second straight line groups, the easily-to-be-etched portions are formed at respective centers of the equilateral-triangular lattices, and
    each of the easily-to-be-etched portions has a larger rate of the wet etching than a rate of the wet etching of remaining portions of the C⁻ plane.

2. The method according to claim 1, wherein the forming the easily-to-be-etched portions comprises:
   forming a mask layer having mask portions corresponding to formation positions of the easily-to-be-etched portions on the C⁻ plane of the semiconductor structure layer;
   subjecting the C⁻ plane of the semiconductor structure layer exposed from the mask layer to plasma irradiation with an inert gas so wet that a rate of the wet etching of portions exposed from the mask layer is smaller than a rate of the wet etching of portions covered by the mask layer; and
   removing the mask layer.

3. The method according to claim 1, wherein the forming the easily-to-be-etched portions comprises:
   forming a metal film, an insulating film, or a resin film having openings corresponding to formation positions of the easily-to-be-etched portions on the C⁻ plane of the semiconductor structure layer such that the wet etching proceeds from the formation positions exposed from the openings.

4. The method according to claim 1, wherein the protrusions formed by the subjecting the C⁻ plane of the semiconductor structure layer to the wet etching are hexagonal pyramid-shaped protrusions each having a base of a regular hexagon having a center at a vertex of a respective one of the equilateral-triangular lattices, and
   each of the hexagonal pyramid-shaped protrusions has side edge portions extending from a top vertex thereof to respective vertices of the base thereof, and each of the side edge portions has a depressed structure.

5. A method of manufacturing a semiconductor light-emitting element including a semiconductor structure layer having a hexagonal crystal structure, the method comprising:
   forming, on a C⁻ plane of the semiconductor structure layer, easily-to-be-etched portions which are arranged discretely based on crystal directions on the C⁻ plane of the semiconductor structure layer; and
   subjecting the C⁻ plane of the semiconductor structure layer to wet etching to form an uneven structure surface including a plurality of protrusions derived from the crystal structure of the semiconductor structure layer on the C⁻ plane of the semiconductor structure layer,
   wherein:
   when the C⁻ plane is subdivided in a mesh form, including equilateral-triangular lattices, by a first straight line group including a plurality of straight lines arranged in parallel with a [1-100] direction, from among the crystal directions on the C⁻ plane of the semiconductor structure layer, and at regular intervals, a second straight line group including a plurality of straight lines arranged in parallel with a [10-10] direction and at the same intervals as the first straight line group, and a third straight line group including a plurality of straight lines arranged in parallel with a [0-110] direction and at the same intervals as the first and second straight line groups, the easily-to-be-etched portions are formed at respective centers of the equilateral-triangular lattices, and
   each of the easily-to-be-etched portions has a larger rate of the wet etching than a rate of the wet etching of remaining portions of the C⁻ plane.

6. The method according to claim 5, wherein the forming the easily-to-be-etched portions comprises:
   forming a mask layer having mask portions corresponding to formation positions of the easily-to-be-etched portions on the C⁻ plane of the semiconductor structure layer;
   subjecting the C⁻ plane of the semiconductor structure layer exposed from the mask layer to plasma irradiation with an inert gas so that a rate of the wet etching of portions exposed from the mask layer is smaller than a rate of the wet etching of portions covered by the mask layer; and
   removing the mask layer.

7. The method according to claim 5, wherein the forming the easily-to-be-etched portions comprises:
   forming a metal film, an insulating film, or a resin film having openings corresponding to formation positions of the easily-to-be-etched portions on the C⁻ plane of the semiconductor structure layer such that the wet etching proceeds from the formation positions exposed from the openings.

8. The method according to claim 5, wherein the protrusions formed by the subjecting the C⁻ plane of the semiconductor structure layer to the wet etching are hexagonal pyramid-shaped protrusions each having a base of a regular hexagon having a center at a vertex of a respective one of the equilateral-triangular lattices, and
   each of the hexagonal pyramid-shaped protrusions has side edge portions extending from a top vertex thereof to respective vertices of the base thereof, and each of the side edge portions has a depressed structure.

9. A method of manufacturing a semiconductor light-emitting element including a semiconductor structure layer having a hexagonal crystal structure, the method comprising:
   forming, on a C⁻ plane of the semiconductor structure layer, easily-to-be-etched portions which are arranged discretely based on crystal directions on the C⁻ plane of the semiconductor structure layer; and
   subjecting the C⁻ plane of the semiconductor structure layer to wet etching to form an uneven structure surface including a plurality of protrusions derived from the crystal structure of the semiconductor structure layer on the C⁻ plane of the semiconductor structure layer,
   wherein:
   when the C⁻ plane is subdivided in a mesh form, including equilateral-triangular lattices, by a first straight line group including a plurality of straight lines arranged in parallel with a [11-20] direction, from among the crystal directions on the C⁻ plane of the semiconductor structure layer, and at regular intervals, a second straight line group including a plurality of straight lines arranged in parallel with a [2-1-10] direction and at the same intervals as the first straight line group, and a third straight line group including a plurality of straight lines arranged in parallel with a [1-210] direction and at the same intervals as the first and second straight line groups, or by a first straight line group including a plurality of straight lines arranged in parallel with a [1-100] direction, from among the crystal directions on the surface of the semiconductor structure layer, and at regular intervals, a second straight line group including a plurality of straight lines arranged in parallel with a [10-10] direction and at the same intervals as the first straight line group, and a third straight line group including a plurality of straight lines arranged in parallel with a [0 −110] direction and at the same intervals as the first and second straight line groups, each of the easily-to-be-etched portions is formed to constitute sides of a regular hexagon having its center at a vertex of the equilateral-triangular lattices thereby obtaining a honeycomb pattern, and each of the easily-to-be-etched portions has a larger rate of the wet etching than a rate of the wet etching of remaining portions of the C⁻ plane.

10. The method according to claim 9, wherein the forming the easily-to-be-etched portions comprises:

forming a mask layer having mask portions corresponding to formation positions of the easily-to-be-etched portions on the C⁻ plane of the semiconductor structure layer;

subjecting the C⁻ plane of the semiconductor structure layer exposed from the mask layer to plasma irradiation with an inert gas so that a rate of the wet etching of portions exposed from the mask layer is smaller than a rate of the wet etching of portions covered by the mask layer; and removing the mask layer.

11. The method according to claim 9, wherein the forming the easily-to-be-etched portions comprises:

forming a metal film, an insulating film, or a resin film having openings corresponding to formation positions of the easily-to-be-etched portions on the C⁻ plane of the semiconductor structure layer such that the wet etching proceeds from the formation positions exposed from the openings.

12. A semiconductor light-emitting element comprising a semiconductor structure layer having a hexagonal crystal structure, wherein:

a surface of the semiconductor structure layer is a C⁻ plane, when the C⁻ plane is subdivided in a mesh form, including equilateral-triangular lattices, by a first straight line group including a plurality of straight lines arranged in parallel with a [11-20] direction, from among crystal directions on the C⁻ plane of the semiconductor structure layer, and at regular intervals, a second straight line group including a plurality of straight lines arranged in parallel with a [2-1-10] direction and at the same intervals as the first straight line group, and a third straight line group including a plurality of straight lines arranged in parallel with a [1-210] direction and at the same intervals as the first and second straight line groups, the C⁻ plane of the semiconductor structure layer has an uneven surface structure including hexagonal pyramid-shaped protrusions each having a base of a regular hexagon having a center at a vertex of a respective one of the equilateral-triangular lattices, and each of the hexagonal pyramid-shaped protrusions has side edge portions extending from a top vertex thereof to respective vertices of the base thereof, and each of the side edge portions has a depressed structure.

\* \* \* \* \*